United States Patent [19]

Huss et al.

[11] Patent Number: 4,975,825
[45] Date of Patent: Dec. 4, 1990

[54] STACKED POWER CONVERTER

[75] Inventors: John Huss; Richard J. Hoppe, both of Rockford; Lawrence E. Crowe, Lindenwood; Thomas Sutrina; Eric D. Lakin, both of Rockford, all of Ill.

[73] Assignee: Sundstrand Corporation, Rockford, Ill.

[21] Appl. No.: 466,067

[22] Filed: Jan. 16, 1990

[51] Int. Cl.⁵ ............................................. H01M 1/00
[52] U.S. Cl. .................................. 363/141; 361/388; 361/395; 363/132
[58] Field of Search ...................... 363/132, 141, 144; 361/410, 414, 381, 388, 395; 174/255, 262, 263, 266

[56] References Cited

U.S. PATENT DOCUMENTS

| 3,452,267 | 6/1969 | Schuler | 363/144 |
| 3,523,215 | 8/1970 | Steinmetz et al. | 361/388 |
| 3,913,003 | 10/1975 | Felkel . | |
| 4,631,573 | 12/1986 | Sutrina | 361/381 |
| 4,872,102 | 10/1989 | Getter | 363/141 |

FOREIGN PATENT DOCUMENTS 126159 5/1989 Japan .

Primary Examiner—William H. Beha, Jr.
Attorney, Agent, or Firm—Marshall, O'Toole, Gerstein, Murray & Bicknell

[57] ABSTRACT

A power converter comprises a plurality of modular circuit boards assembled in a stacked relationship. The circuit boards include heat exchangers which are interconnected and cooling fluid is provided thereto to remove heat generated by high power devices.

10 Claims, 14 Drawing Sheets

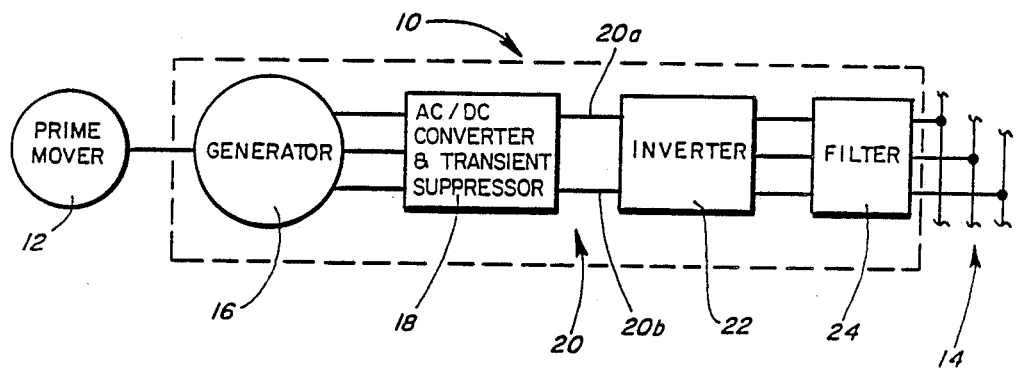
FIG. 1
FIG. 3
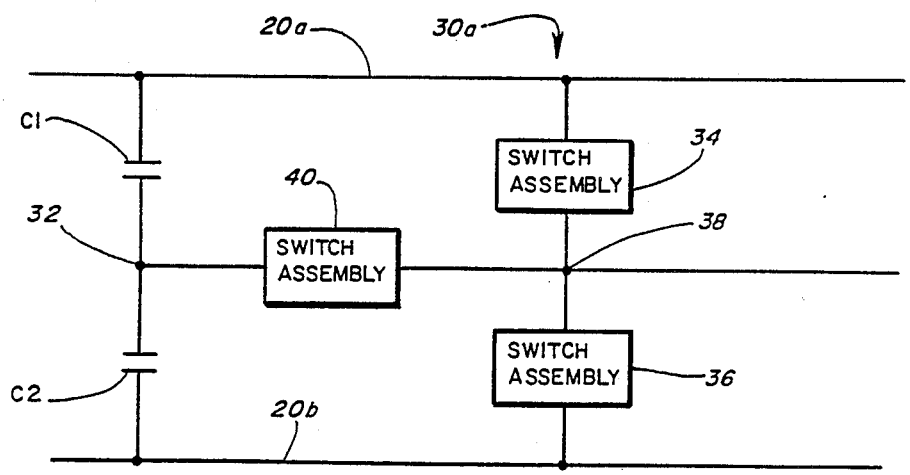

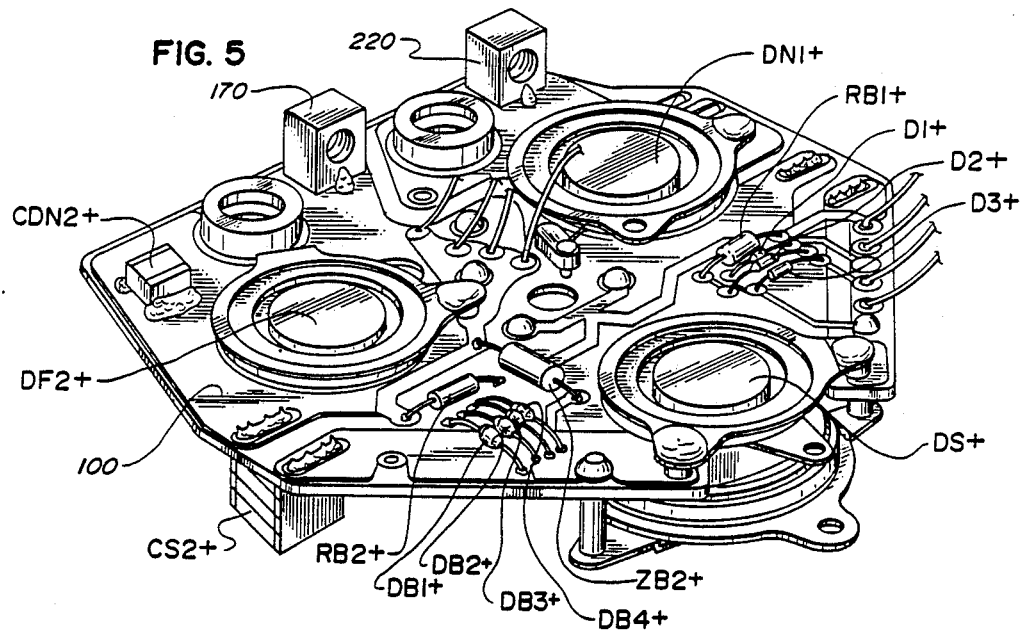
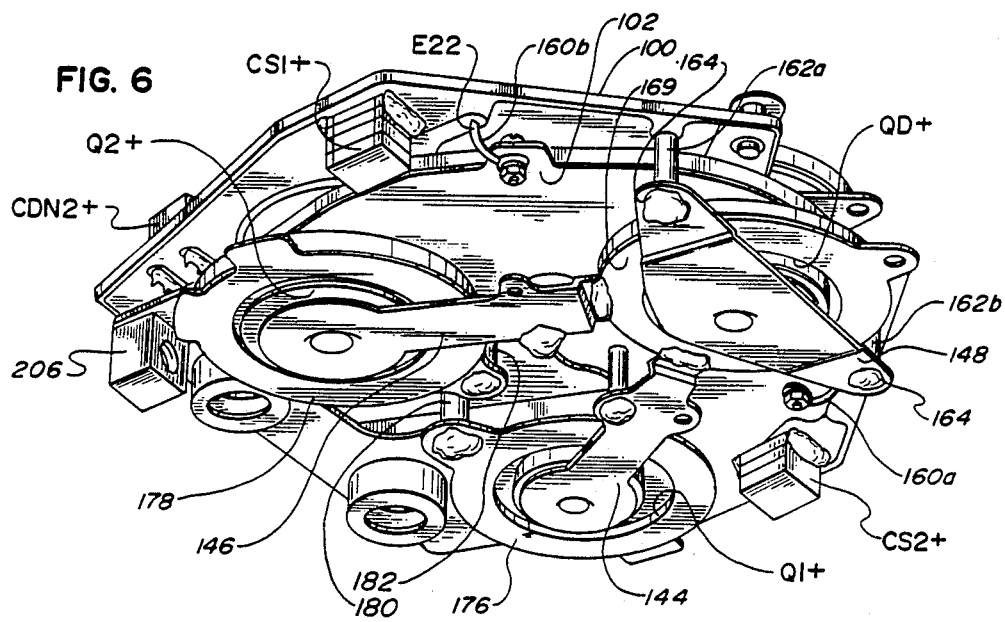

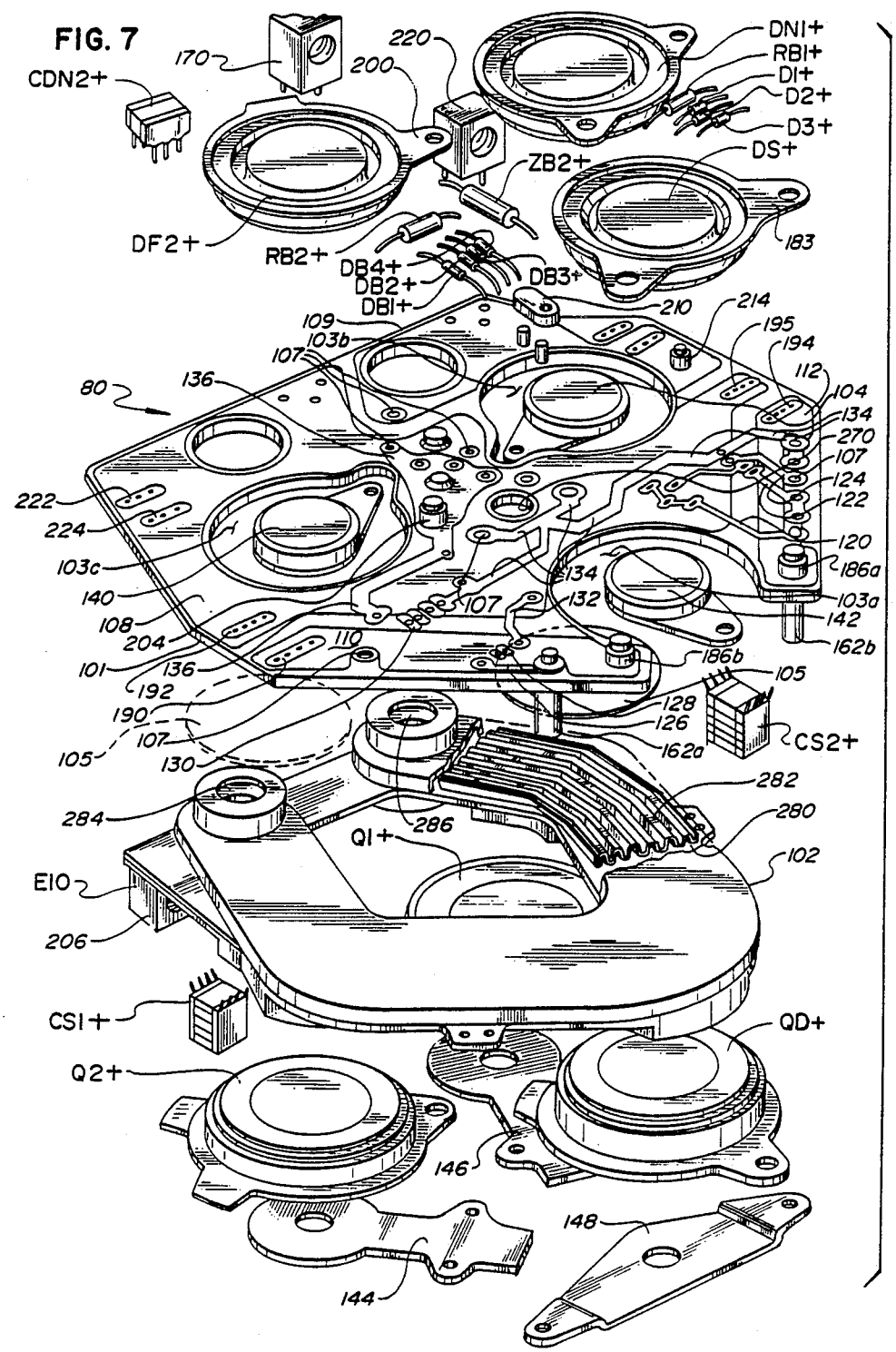

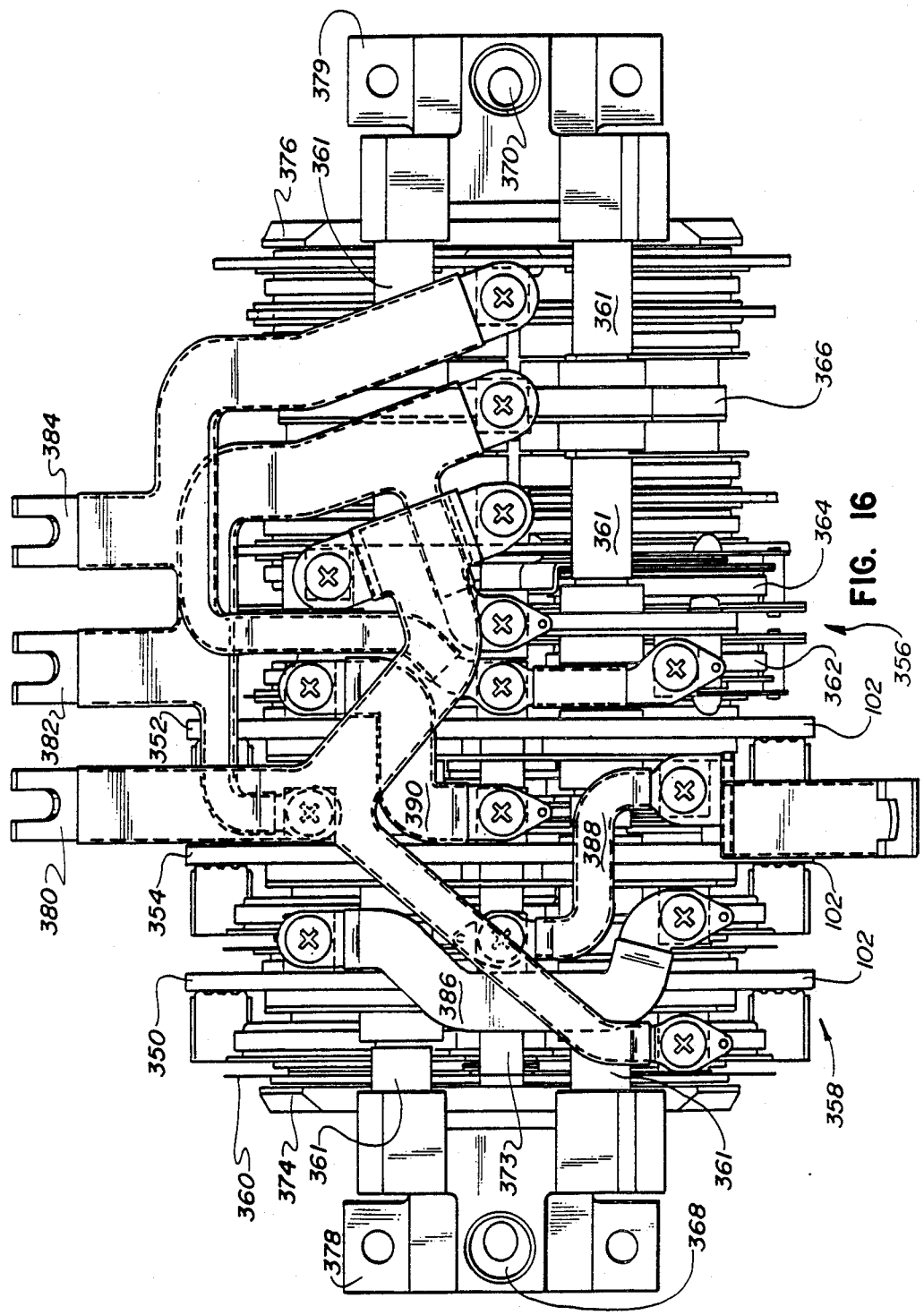

4,975,825

STACKED POWER CONVERTER

TECHNICAL FIELD

The present invention relates generally to power converters, and more particularly to a power converter assembled on multiple circuit boards.

BACKGROUND ART

In a variable-speed, constant-frequency (VSCF) power generating system, variable-frequency power produced by a brushless, synchronous generator may be converted by a power converter into constant-frequency AC power. The power converter includes a rectifier bridge for converting the variable-frequency power into DC power on DC link conductors, a transient suppressor for dissipating transients on the DC link conductors and an inverter for converting the DC power into the constant-frequency AC power. The inverter may be, for example, of the neutral point clamped type having positive and negative switch assemblies connected in series across the DC link conductors and a neutral switch assembly connected between a neutral voltage and a junction between the positive and negative switch assemblies.

Such VSCF systems are often used in aircraft or aerospace environments where space is at a premium, and hence it is desirable to minimize the size of the system. However, the rectifier bridge, transient suppressor and inverter include high power components which generate substantial amounts of heat that must be removed from the vicinity of the system. The need to remove this heat complicates the physical design of the system and has, in the past, limited the degree to which the size of the system can be reduced.

It is necessary that the connections to the electrodes of the high power devices have as little resistance as possible to minimize power dissipation and heat generation. Typically, this is accomplished by applying compressive force to the devices themselves, in turn insuring intimate physical contact of the electrodes with other components. This further complicates the physical design of the system.

Sutrina, U.S. Pat. No. 4,631,573, assigned to the assignee of the instant application, discloses a cooling system for stacked semiconductors. The cooling system includes a plurality of heat sinks each including planar opposed surfaces and fluid flow ports. The heat sinks are arranged in pairs such that planar faces of the sinks of each pair are adjacent one another with an electrically insulating sheet is disposed therebetween. The pairs are arranged relative to one another to form spaces therebetween and semiconductors are disposed in the spaces. The resulting stack is maintained in assembled relation by a clamp. The heat sinks are interconnected by electrically insulative tubing and the interconnected heat sinks are provided cooling fluid which removes heat from the semiconductors.

Felkel, U.S. Pat. No. 3,913,003 discloses a plurality of stacked building blocks which together make up a power converter.

SUMMARY OF THE INVENTION

In accordance with the present invention, a power converter includes circuit boards which are stacked to provide a compact assembly.

More particularly, a power converter assembly comprises first and second circuit boards each of which includes an aperture therethrough, first and second heat exchangers secured to the first and second circuit boards, respectively, and first and second high power devices disposed adjacent the first and second heat exchangers, respectively. Means apply compressive force through the board apertures against the high power devices and the heat exchangers to cause the first and second high power devices to be in intimate physical contact with the first and second heat exchangers, respectively, so that low resistance electrical paths are established between the high power devices and the heat exchangers. Means are disposed on the boards for connecting the power devices between an input and an output of the power converter assembly.

More particularly, an inverter includes a plurality of substrates, each having three apertures therethrough. An electrically and thermally conductive heat exchanger is bonded to each substrate and overlies the apertures. Three power diodes are disposed within the apertures adjacent a first side of the heat exchanger while three power transistors are disposed adjacent a second side of the heat exchanger. Electrical components are disposed on the substrate and interconnected with the diodes and transistors. Each substrate and heat exchanger bonded thereto forms a circuit board and the circuit boards are assembled in stacked relationship with electrically insulating spacers disposed between the board. First and second end caps are disposed adjacent first and second ends of the stack and a threaded bar or rod passes through aligned apertures in the end caps and the boards. Fasteners are threaded on to the ends of the rod and apply compressive force to the power transistors, power diodes and heat exchangers as noted above so that the boards are maintained in a stacked relationship.

BRIEF DESCRIPTION OF THE DRAWINGS

FIG. 1 comprises a block diagram of a variable-speed, constant-frequency power generating system in conjunction with a prime mover;

FIG. 3 comprises a block diagram of one leg of the inverter shown in FIG. 2;

FIG. 5 is a perspective view of a first side of a circuit board configured to form a positive switch assembly;

FIG. 6 is a perspective view of a second side of the circuit board of FIG. 5;

FIG. 7 comprises an exploded perspective view of the circuit board of FIG. 5 illustrating various electrical components separated from the circuit board;

FIG. 16 comprises an elevational view of circuit boards assembled in a second stack and forming a third leg of the inverter together with the AC/DC converter and transient suppressor of FIG. 2.

DESCRIPTION OF THE PREFERRED EMBODIMENT

Figure 2:
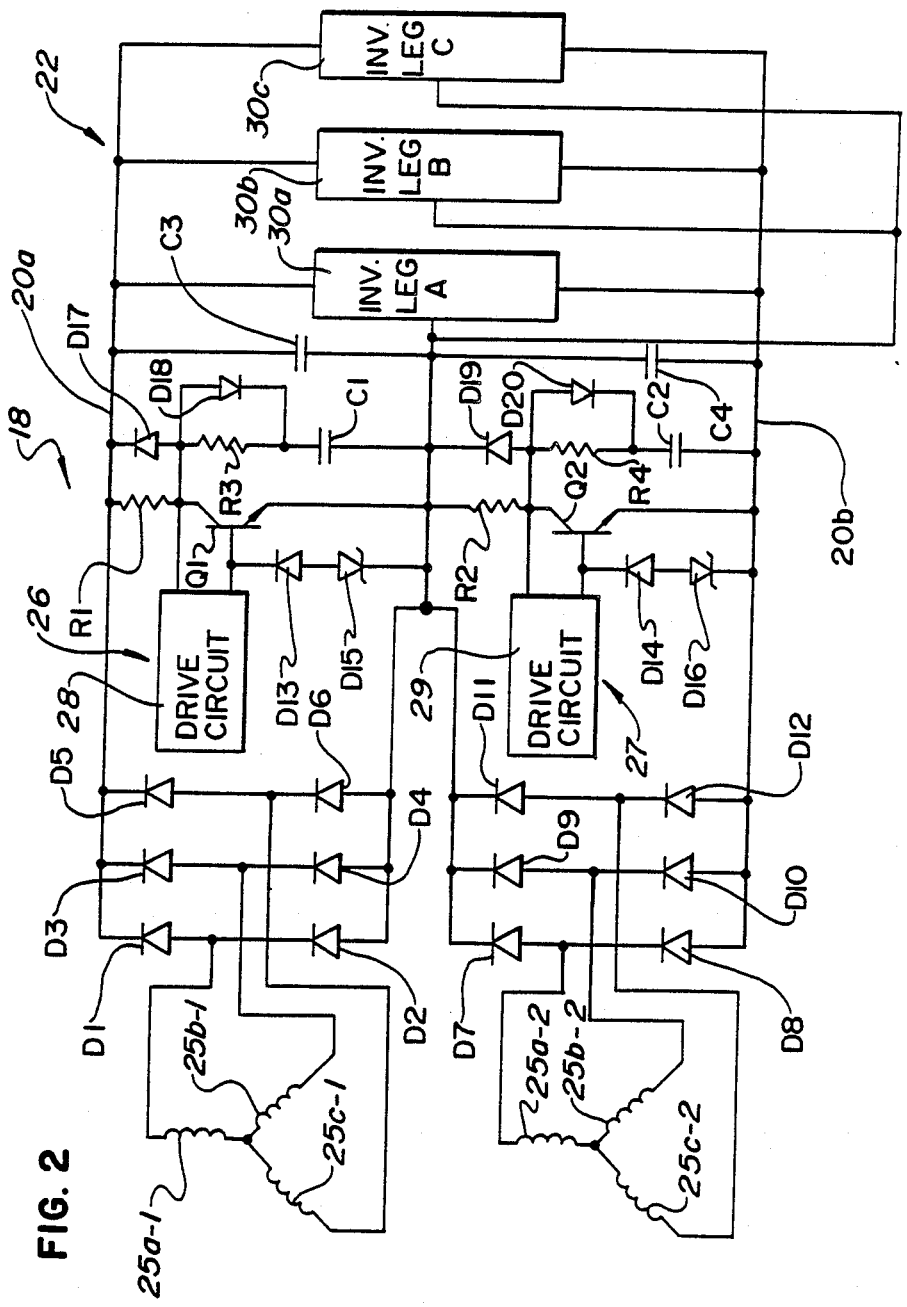
FIG. 2 comprises a block diagram of the AC/DC converter and transient suppressor and the inverter shown in FIG. 1.

Referring now to FIG. 1, a variable-speed, constant-frequency (VSCF) power generating system 10 converts variable-speed motive power produced by a prime mover 12, such as an aircraft jet engine, into constant-frequency AC electrical power on a load bus 14. It should be noted that various contactors which connect the VSCF system 10 to the AC load bus 14 are not shown for the sake of simplicity.

The VSCF system 10 includes a brushless, synchronous generator 16 which converts the variable-speed motive power produced by the prime mover 12 into variable-frequency AC power. This AC power is converted by an AC/DC converter and transient suppressor 18 into DC power on a DC link 20 including DC link conductors 20a, 2b. A DC link filter (not shown) may be provided to minimize ripple in the DC power on the DC link 20. The inverter 22 converts the DC power into constant-frequency AC power which is filtered by an optional filter 24 and provided to the AC load bus 14.

Referring now to FIG. 2, the AC/DC converter and transient suppressor 18 includes a first rectifier bridge comprising diodes D1–D6 connected in a conventional three-phase bridge configuration and a second rectifier bridge comprising diodes D7–D12 also connected in a conventional three-phase bridge configuration. The rectifier bridges comprising the diodes D1–D6 and D7–D12 are coupled between two sets of three-phase windings 25a-1, 25b-1, 25c-1 and 25a-2, 25b-2, 25c-2 of the generator 16 and first and second transient suppressor circuit 26, 27, respectively. The transient suppressor circuits 26, 27 are identical and prevent overvoltage conditions on the DC link conductors 20a, 20b due to step load removal, reactive power from the load and the like. The circuit 26 includes a power transistor Q1 which is controlled by a drive circuit 28 whereas the circuit 27 includes a power transistor Q2 controlled by a drive circuit 29. The drive circuit 28 turns the transistor Q1 on to draw current through a power dissipating resistor R1 when the voltage across the DC link conductor 20a and a neutral conductor 32 exceeds a predetermined level. Similarly, the drive circuit 29 turns on the transistor Q2 to draw current through a power dissipating resistor R2 when the voltage across the neutral conductor 32 and the DC link conductor 20b exceeds a certain level. The power dissipating resistors R1 and R2 dissipate sufficient power to prevent an overvoltage condition on the DC link conductors 20a, 20b relative to a neutral voltage on the neutral conductor 32.

Each of the circuits 26, 27 includes base biasing and snubber circuits in the form of diodes D13 and D14 and zener diodes D15 and D16. In addition, snubber components including capacitors C1, C2, resistors R3, R4 and diodes D17–D20 are coupled to the power switches Q1 and Q2, the DC link conductors 20a, 20b and the neutral conductor 32.

The inverter 22 is preferably, although not necessarily, of the three-phase type including first through third inverter legs 30a, 30b and 30c which are coupled to the DC link conductors 20a, 20b and the neutral conductor 32. A pair of DC link capacitors C3 and C4 are coupled across the DC link conductors 20a, 20b.

FIG. 3 illustrates the inverter leg 30a in greater detail, it being understood that the legs 30b and 30c are identical thereto. Positive and negative switch assemblies 34 and 36 are coupled in series across the DC link conductors 20a, 20b. A phase output is produced at a terminal 38 which comprises the junction between the switch assemblies 34 and 36. A neutral switch assembly 40 is coupled between the phase output terminal 38 and the neutral terminal 32.

The switch assemblies 34, 36, 40 are operated to produce an AC waveform at the output terminal 38 comprising a series of alternating positive and negative half-cycles. The positive half-cycle is produced by alternately operating the switch assemblies 34 and 40 in a pulse-width modulated (PWM) mode. Each negative half-cycle is produced by alternately operating the switch assemblies 36 and 40 in a PWM mode. The output voltage produced at the terminal 38 thus switches between a positive or negative level and the neutral voltage, but not between the positive and negative levels. The inverter is thus referred to as a neutral point clamped type inverter. It should be noted that inverter 22 need not be of this type, in which case the neutral switch assembly 40 of the leg 30a and the corresponding neutral switch assemblies of the legs 30b and 30c would not be needed. In this case, the switch assemblies 34 and 36 may be alternately operated in a PWM mode or may be operated to produce a stepped output waveform, if desired.

Figure 4:
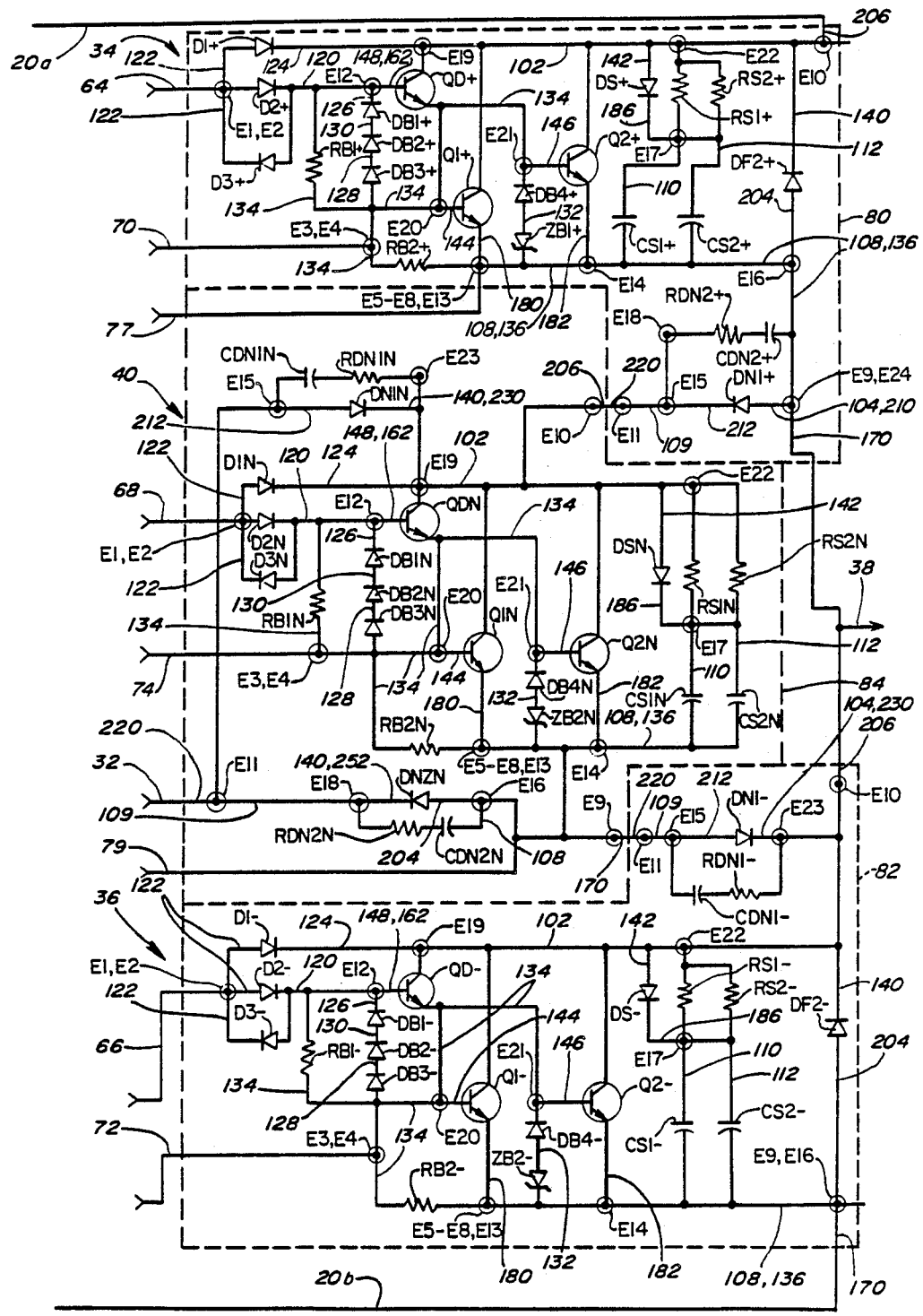
FIG. 4 comprises a schematic diagram of power switches together with base biasing, snubber and flyback circuitry of the inverter leg shown in block diagram form in FIG. 3.

Referring now to FIG. 4, the positive switch assembly 34 includes a high power driver transistor QD+ which is connected in a Darlington configuration with high power driven transistors Q1+ and Q2+. Connected to the bases of the transistors QD+, Q1+ and Q2+ is base biasing circuitry including diodes D1+ through D3+ and DB1+ through DB3+ together with biasing resistors RB1+ and RB2+. An additional diode DB4+ together with a zener diode ZB1+ are connected to the bases of the transistors Q1 and Q2.

Connected across the collectors and emitters of the driven transistors Q1+ and Q2+ are flyback and snubber circuits including a high power flyback diode DF2+, a high power snubber diode DS+, snubber resistors RS1+, RS2+ and snubber capacitors CS1+, CS2+.

The negative switch assembly 36 includes identical components described above in connection with the positive switch assembly 34. In order to distinguish between the components of the negative switch assembly and the components of the positive switch assembly, the plus signs in the reference designations for the components of the positive switch assembly 34 are replaced by negative signs for the components of the negative switch assembly 36.

The neutral switch assembly 40 includes base biasing components D1N through D3N, DB1N through DB4N, RB1N, RB2N and ZB2N, power switching components including a driver transistor QDN and driven transistors Q1N, Q2N and snubber components DSN, RS1N, RS2N, CS1N and CS2N. These components correspond to the components D1+ through D3+, DB1+ through DB4+, RB1+, RB2+, ZB2+, QD+, Q1+, Q2+, DS+, RS1+, RS2+, CS1+, and CS2+, respectively, of the positive switch assembly 34. In addition, the neutral switch assembly 40 includes diodes DN1+, DN1−, DN1N and DN2N, snubber resistors RDN2+, RDN1−, RDN1N and RDN2N and snubber capacitors CDN2+, CDN1−, CDN1N and CDN2N.

Current flow between the neutral terminal 32 and the phase output 38 is accomplished in a bi-directional fashion utilizing the high power diodes DN1+, DN1−, DN1N and DN2N, together with the switches QDN, Q1N and Q2N. More specifically, current flow from the phase output 38 to the neutral terminal 32 occurs through the diode DN1+, the transistors QDN, Q1N and Q2N and the diode DN2N. Conversely, current flow from the neutral terminal 32 to the phase output 38 takes place through the diode DN1N, the transistors QDN, Q1N and Q2N and the diode DN1−.

The switches of each switch assembly 34, 36 and 40 are turned on by positive base currents supplied over lines 64, 66 and 68, respectively. The switches are turned off by drawing current out of the bases of these transistors over the lines 64, 66 and 68 and through additional lines 70, 72 and 74 which are coupled to the bases of the driven transistors Q1+ and Q2+, Q1− and Q2− and Q1N and Q2N, respectively. Ground references for the switch assemblies 34 and 40 are provided over lines 77 and 79 while a ground reference is provided for the switch assembly 36 by the DC link conductor 20b. It should be understood that the circuitry for turning the transistors of these switch assemblies on and off is unimportant to an understanding of the present invention, and is not described in detail herein.

The components of FIG. 4 may be packaged as three separate units as illustrated by the dashed lines of FIG. 4 which in turn leads to a desirable standardization of the units. More particularly, the diode DN1+, resistor RDN2+ and capacitor CDN2+ may be packaged on a circuit board 80 together with the power switches and the base biasing, snubber and flyback circuits of the switch assembly 34. The diode DN1−, capacitor CDN1− and resistor RDN1− may be packaged on a circuit board 82 together with the power switches and the base biasing, snubber and flyback circuits of the negative switch assembly 36. The diodes DN1N, DN2N, the capacitors CDN1N and CDN2N and the resistors RDN1N and RDN2N may be packaged on a single circuit board 84 with the power switches and the base biasing and snubber circuits of the neutral switch assembly 40. Inasmuch as the neutral switch assembly 40 does not require a flyback diode, it can be seen that such a packaging arrangement results in a substantially identical number of components on each circuit board 80, 82 and 84, except that the board 84 includes an extra resistor and capacitor as compared with the boards 80 and 82. This arrangement of components allows the design of the board to be standardized so that a single board blank can be configured to form a positive switch assembly, a negative switch assembly or a portion of a neutral switch assembly, as desired.

FIG. 5 illustrates the circuit board 80 in detail from a first or a top side thereof while FIG. 6 illustrates the board from a second or lower side thereof. As seen in these FIGS., the board includes a substrate 100 which is bonded to a heat exchanger 102. The heat exchanger 102 is electrically and thermally conductive and is preferably fabricated of aluminum. The heat exchanger 102 forms a collector bus for the switch assembly 34 and assists in removing heat from the high power devices DS+, DF2+, DN1+, QD+, Q1+ and Q2+. As seen specifically in FIG. 4, the diodes DS+, DF2+ and DN1+ are disposed in apertures 103a–103c, respectively, through the substrate 100 in thermal contact with a first side of the heat exchanger 102 while the transistors QD+, Q1+ and Q2+ are disposed in electrical and thermal contact with a second side of the heat exchanger 102. The diodes DS+ and DF2+ are directly electrically connected to the collector bus formed by the heat exchanger 102. As seen in the exploded view from the top side of FIG. 7, a conductive pad 104 and an electrically insulating, thermally-conductive Kapton spacer 105 are disposed between the anode of the diode DN1+ and the heat exchanger 102 so that the anode can be connected to other components described below. "Kapton" is a registered trademark of E.I. DuPont de Nemours and Company for flexible film for electrical insulation.

Figure 8:
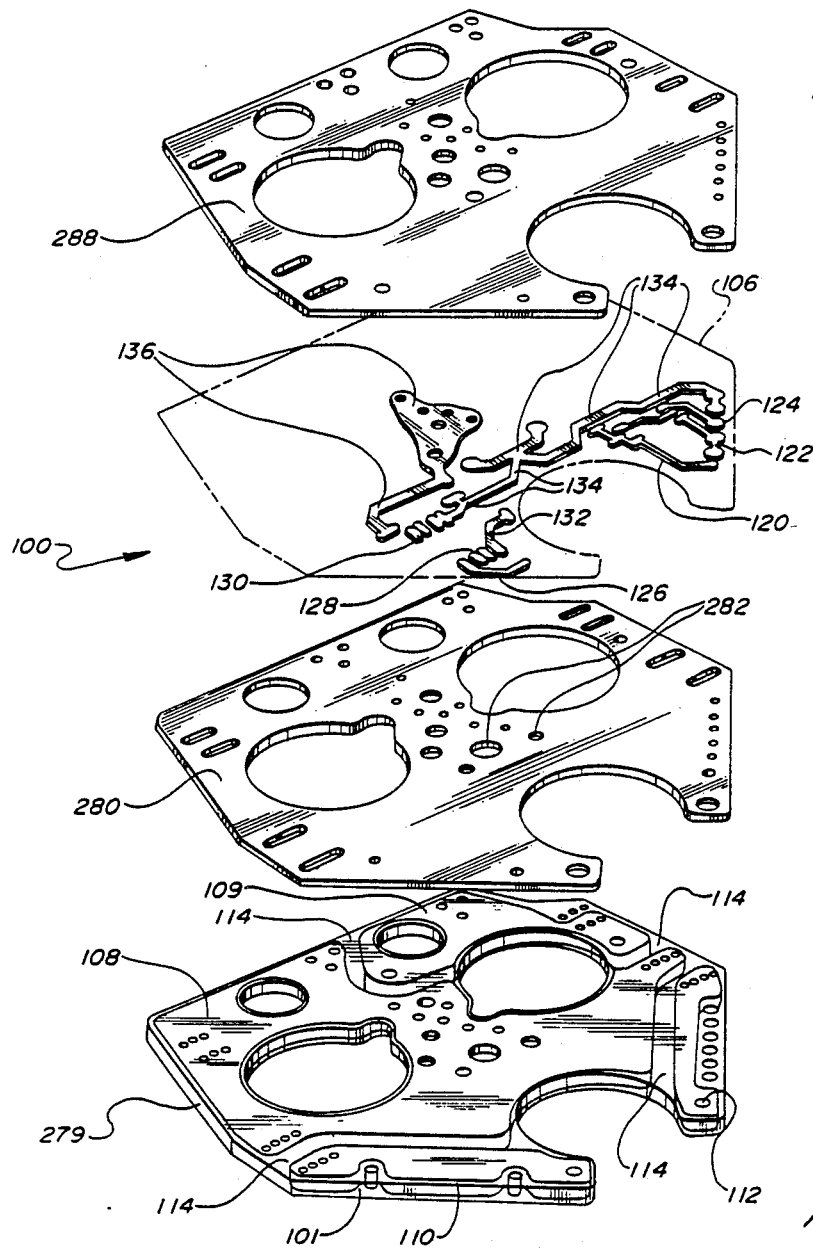
FIG. 8 comprises an exploded perspective view from the first side of the circuit board of FIG. 5 illustrating several of the layers thereof.

The diodes D1+ through D3+, DB1+ through DB4+ and ZB1+, the resistors RB1+ and RB2+ and the capacitors CS1+, CS2+ and CDN2+ are mounted on the substrate 100. The resistors RS1+, RS2+ and RDN2+ comprise planar etched foil resistors which are formed as a layer by an etching process between etched electrically insulating layers IL1 and IL2, FIG. 9. Referring also to FIGS. 7 and 8, a series of conductive traces forming a trace layer 106, a pair of etched insulating layers IL3, IL4 and a series of via holes 107 (several of which are identified in FIG. 7) are provided as a part of the substrate 100. The insulating layers IL1–IL4, the etched foil resistors and the trace layer 106 are disposed on a main layer 101 having three buses comprising an emitter bus 108, an input/output bus 109 and first and second capacitor buses 110, 112. Spaces between the buses 108, 109, 110 and 112 are occupied by electrically insulative filler material 114 and the portions are bonded together by a bonding agent, such as epoxy, to form the main layer 101. The filler material 114 may be a commercially available product known commonly as G10 material which conforms to military specification MIL P13949.

Figure 9:
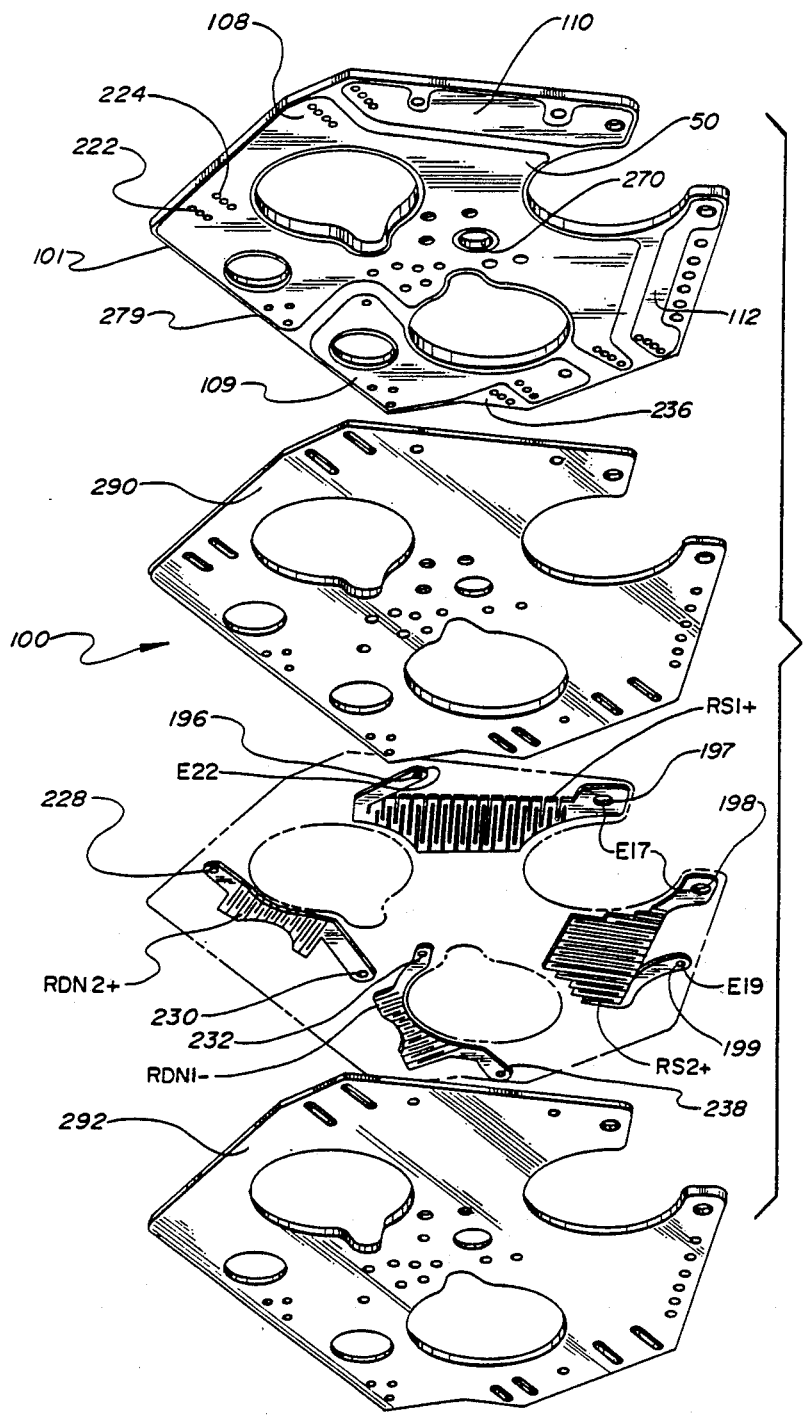
FIG. 9 comprises an exploded perspective view from the second side of the circuit board of FIG. 5 illustrating the remainder of the layers thereof.
Figure 10:
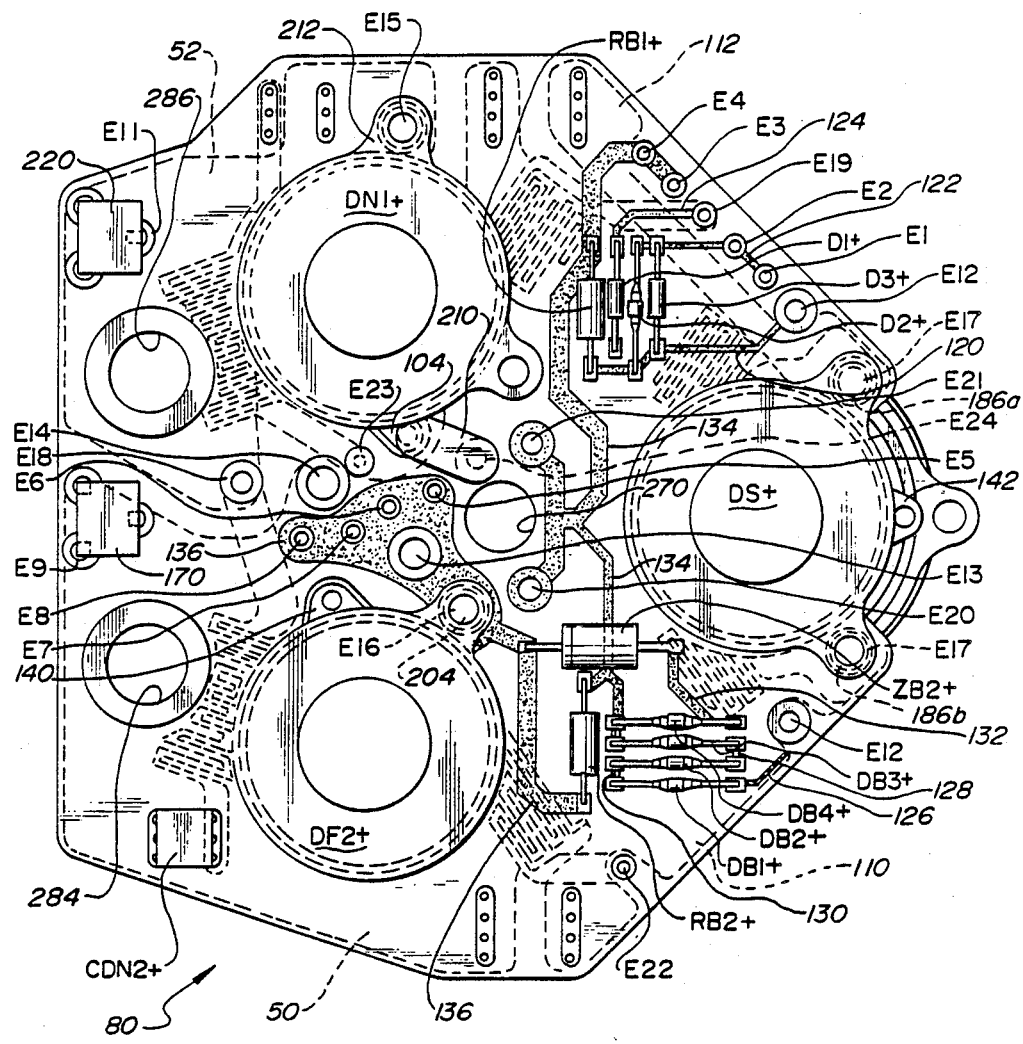
FIG. 10 comprises a plan view of the first side of the circuit board of FIG. 5.

The trace layer 106 includes a series of traces 120, 122, 124, 126, 128, 130, 132, 134 and 136 which are deposited on the insulating layer IL3, FIG. 8, again by an etching process. The insulating layer IL4, is disposed atop the traces. The via holes 107, the traces 120–136, the buses 108, 109, 110 and 112, the heat exchanger 102, the conductive pad 104, additional conductive pads 140, 142 and electrically conductive plates 144, 146 and 148 interconnect the various components on the board 80. Various junction points in the schematic of FIG. 4 are identified by a number preceded by the letter E and are shown in FIGS. 9 and 10. The schematic of FIG. 4 also includes reference numerals identifying the interconnection of the components on the board by the conductive pads 104, 140, 142, the heat exchanger 102, the conductive traces 120–136, the buses 108, 109, 110 and 112 and the plates 144, 146 and 148 as well as conductive mounting posts hereinafter described.

More particularly, the trace 122 couples connection points E1 and E2 to the anodes of the diodes D1+ and D2+ and to the cathode of the diode D3+. The trace 124 couples the cathode of the diode D1+ to a connection point E19 which is in turn coupled by a wire 160a, FIG. 6, to the heat exchanger 102. A further connection point E22 is coupled to the heat exchanger 102 by a further wire 160b. The wires 160a, 160b are soldered to the connection points E19, E22 and are bolted to the heat exchanger 102.

The conductive trace 120, FIG. 10, connects the diodes D2+, D3+60 and the resistor RB1+ to a connection point E12. The connection point E12 is also coupled by the conductive plate 148 and a pair of conductive mounting posts 162a, 162b, FIG. 6, to the base or control electrode of the driver transistor QD+. The mounting posts are secured to the substrate 100 and are soldered to the conductive plate 148 at points 164 to securely hold the emitter of the transistor QD+ in electrical contact with the heat exchanger 102.

The conductive traces 126, 128, 130 and 134, FIG. 10, connect the diodes DB1+ through DB3+ in series between the connection point E12 and a pair of connection points E3, E4. These latter two connection points are coupled to the line 70.

The conductive trace 134 also connects the resistor RB1+ to a pair of connection points E20 and E21. These connection points are coupled to the bases of the transistors Q1+ and Q2+ by the conductive plates 144, 146, FIGS. 6 and 7. The emitter of the transistor QD+ is coupled to the bases of the transistors Q1+ and Q2+ by soldering or otherwise electrically connecting the conductive plates 144, 146 to an emitter electrode 169 of the transistor QD+, as seen in FIG. 6.

The conductive traces 132, 136 connect the diodes DB4+ and ZB1+ between the connection point E21 and the emitter bus 108. The conductive trace 136 connects the emitter bus 108 to connection points E5-E8, E13, E14 and E16. In addition, a connection point E9 is coupled to the emitter bus 108 and a connector 170 is mounted on the board 80 which is in turn coupled to the phase output terminal 38. A connection point E24 is also coupled to the emitter bus 108.

As seen specifically in FIG. 6, emitter electrodes 176, 178 of the transistors Q1+ and Q2+, respectively, are coupled by electrically conductive mounting posts 180, 182, respectively, to the emitter bus 108.

Referring again to FIGS. 7 and 10, the conductive pad 142 connects the anode of the transistor DS+ to the heat exchanger 102. A cathode plate 183 of the diode DS+ is coupled by a pair of electrically conductive mounting posts 186a, 186b to a pair of connection points E17. The connection points E17 are in turn coupled to the capacitor buses 110, 112. The capacitor CS1+ is soldered into via holes 190, 192 so that the capacitor CS1+ is connected between the capacitor bus 110 and the emitter bus 108. In like fashion, the capacitor CS2+ is connected between the capacitor bus 112 and the emitter bus 108 by soldering the electrodes thereof into via holes 194, 195.

The holes 190 and 194 are plated through so that the capacitors CS1+ and CS2+ are connected by the buses 110, 112 to the etched foil resistors RS1+ and RS2+. As seen in FIG. 9, the resistor RS1+ includes terminals 196, 197 which are connected between connection points E17 and E22 whereas the resistor RS2+ includes terminals 198, 199 which are connected between the connection points E17 and E19.

The cathode of the diode DF2+ is connected by the electrically conductive pad 140 to the heat exchanger 102. An anode terminal 200 of the diode DF2+ is coupled by an electrically conductive post 204, FIG. 7, to the emitter bus 108.

A connector 206 comprises a part of the heat exchanger 102 and comprises a connection point E10. In the case of the board 80, the connector 206 provides a means for connecting the DC link conductor 20a to the heat exchanger 102.

An anode of the diode DN1+, FIGS. 7 and 10, is coupled by the conductive pad 104 and a jumper 210 to the connection point E24. A cathode electrode 212 of the diode DN1+ is coupled to an electrically conductive mounting post 214 which is shown in detail in FIG. 7. The connection point E15 is in turn coupled to the input/output bus 109, as are connection points E11 and E18. As seen in FIG. 10, a connector 220 is coupled to the input/output bus 109 to allow the board 80 to be connected to the board 84.

The capacitor CDN2+ is soldered into via holes 222 and 224 which, as seen in FIG. 9, extend through the emitter bus 108 into the etched foil resistor layer. The via holes 224 are not plated fully through the board 80 so that the pins of the capacitor CDN2+ soldered therein do not make electrical contact with the emitter bus 108. These pins of the capacitor do, however, establish electrical contact with a terminal 228 of the etched foil resistor RDN2+ so that the capacitor CDN2+ is coupled between the emitter bus and such resistor.

A second terminal 230 of the resistor RDN2+ is coupled to the connection point E18, which is in turn coupled by the input/output bus 109 to the connection point E11.

Figure 11:
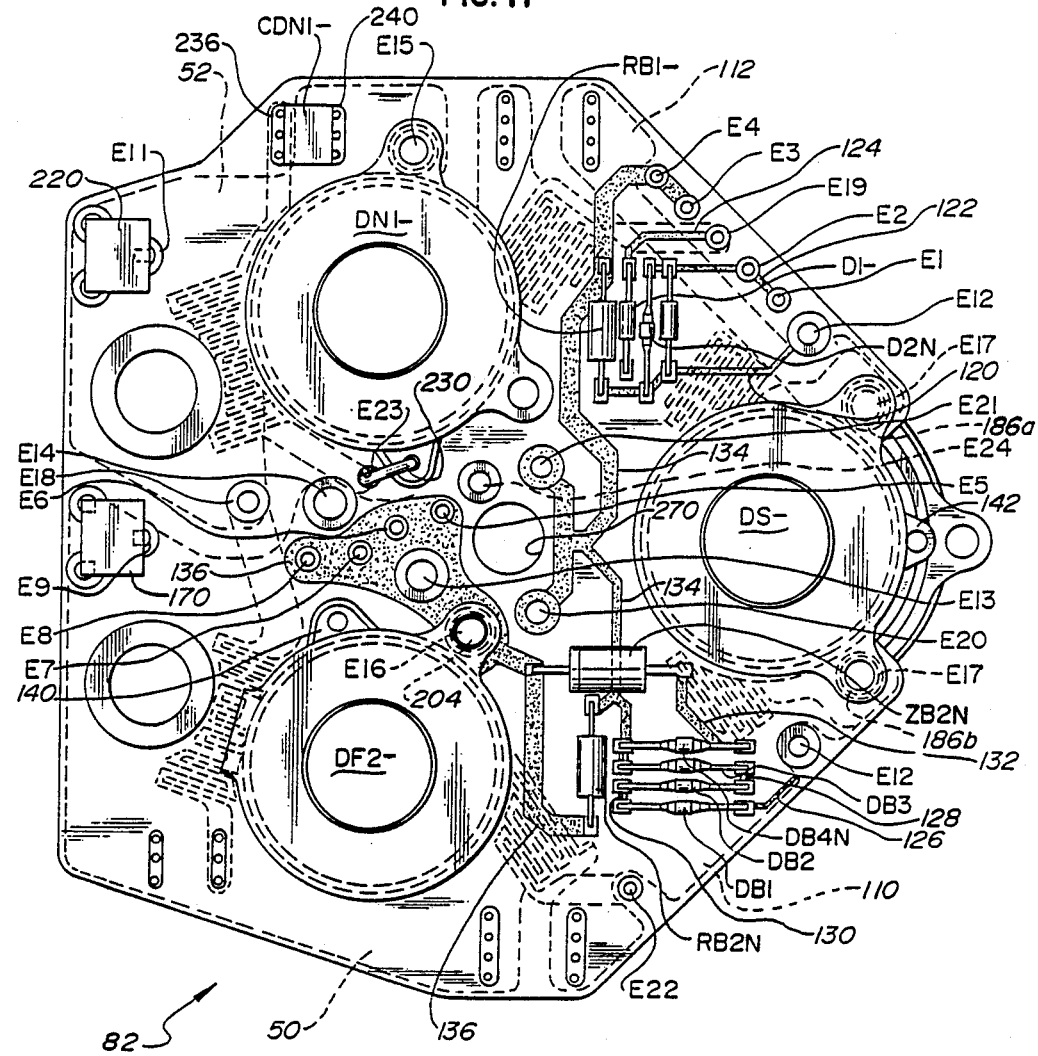
FIG. 11 comprises a plan view of the first side of a circuit board configured to form a negative switch assembly.

Referring now to FIG. 11, the board 82 for the negative switch assembly 36 is identical to the board 80 with the following exceptions. Elements common to FIGS. 10 and 11 are assigned like reference numerals with the exception of electrical components wherein a minus sign is substituted for a plus sign, as noted previously. The diode DN1— is turned over as compared with the diode DN1+ so that the anode of the diode DN1— is coupled to the connection point E15. Further, the electrically insulating spacer 105 is not used so that the cathode of the diode DN1— is coupled electrically and thermally to the heat exchanger 102.

The jumper 210 is not utilized in the negative switch assembly of FIG. 11. Rather, a jumper 230 connects the electrically conductive pad 104, and hence the cathode of the diode DN1—, to a connection point E23 which is in turn coupled to a first terminal 232 of the etched foil resistor RDN1— seen in FIG. 9. A capacitor CDN1— includes pins which extend through via holes 236 to connect to a second terminal 238 of the resistor RDN1—. A second set of pins of the capacitor CDN1— extend through via holes 240 to establish electrical contact with the input/output bus 109.

The capacitor CDN2+ is not used in the negative switch assembly 36. By omitting this capacitor, the resistor RDN2+ is likewise not used.

Figure 12:
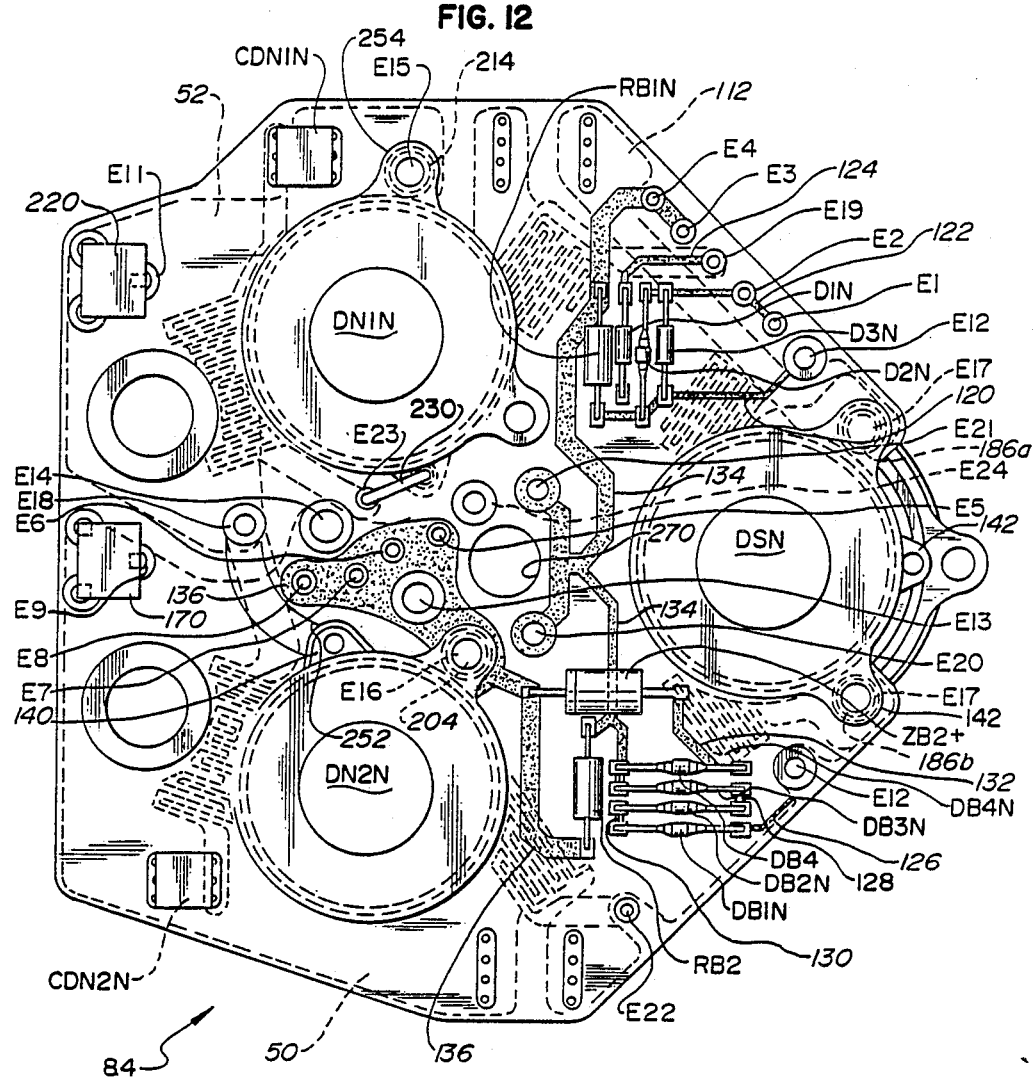
FIG. 12 comprises a plan view of the first side of a circuit board configured to form a portion of a neutral switch assembly.

Referring now to FIG. 12, the circuit board 84 forming a portion of the neutral switch assembly is illustrated in greater detail. Again, elements common between FIGS. 10 and 12 are assigned like reference numerals, with the exception that electrical components are identified by the suffix N instead of the plus sign. As before, only the differences between the boards 80 and 84 will be described in detail.

The insulating spacer 105 is not used in the board 84 so that the cathode of a diode DN1N is coupled to the heat exchanger 102. Instead, the electrically insulating spacer 105 shown in phantom in FIG. 7 is placed between the conductive pad 140 and the heat exchanger 102 so that the cathode of a diode DN2N is electrically insulated therefrom. An electrically conductive jumper 252 connects the cathode to the connection point E18. This connection point is in turn coupled by the input/output bus 109 to a capacitor CDN1N and an anode electrode 254 of a diode DN1N via the mounting post 214. The diode DN1N is turned upside down as compared with the diode DN1+ of the board 80 so that the cathode electrode thereof faces and is in electrical contact with the heat exchanger 102. The cathode electrode of the diode DN1N and the heat exchanger 102 are coupled by the conductive pad 140 and the jumper 230 to the connection point E23.

The capacitor CDN1N is coupled between the connection point E15 and the resistor RDN1N. A capacitor CDN2N is coupled to the anode of the diode DN2N by the emitter bus 108 at the connection point E16. The resistor RDN2N is connected between the capacitor CDN2N and the connection point E18.

Referring again to FIG. 4, the boards 80, 82 and 84 are interconnected by bus bars so that the connection point E11 of the board 80 is connected to the connection point E10 of the board 84 using the connectors 220 and 206 and so that the connection point E11 of the board 82 is connected to the connection point E9 of the board 84 using the connectors 220 and 170. The phase output terminal 38 is coupled to the connection point E24 of the board 80 via the connector 170 and to the connection point E10 of the board 82 via the connector 206. The DC link conductor 20a is coupled to the connection point E10 of the board 80 using the connector 206. The DC link conductor 20b is coupled to the emitter bus 108 of the board 82 using the connector 170. The neutral terminal 32 is coupled to the connection point E11 of the board 84 by the connector 220.

In the preferred embodiment, the value and rating of corresponding components on the boards 80, 82 and 84 are the same so that the boards can be manufactured and shipped with such components thereon absent the jumpers 210, 230 and 252 and without the insulating pad or spacer 105. Such a board blank may then be configured for a positive switch assembly 34 by adding the insulating pad 105, the jumper 210 and the capacitor CDN2+, as noted in greater detail above. The board could alternatively be configured as the negative switch assembly 36 by adding the jumper 230 and the capacitor CDN1− and by reversing the diode DN1− as compared with the diode DN1+ or may be configured as a neutral switch assembly 40 by adding the jumpers 230 and 252, the insulating pad 105 and the capacitors CDN1N, CDN2N and by reversing the diode DN1N as compared with the diode DN1+.

Figure 13:
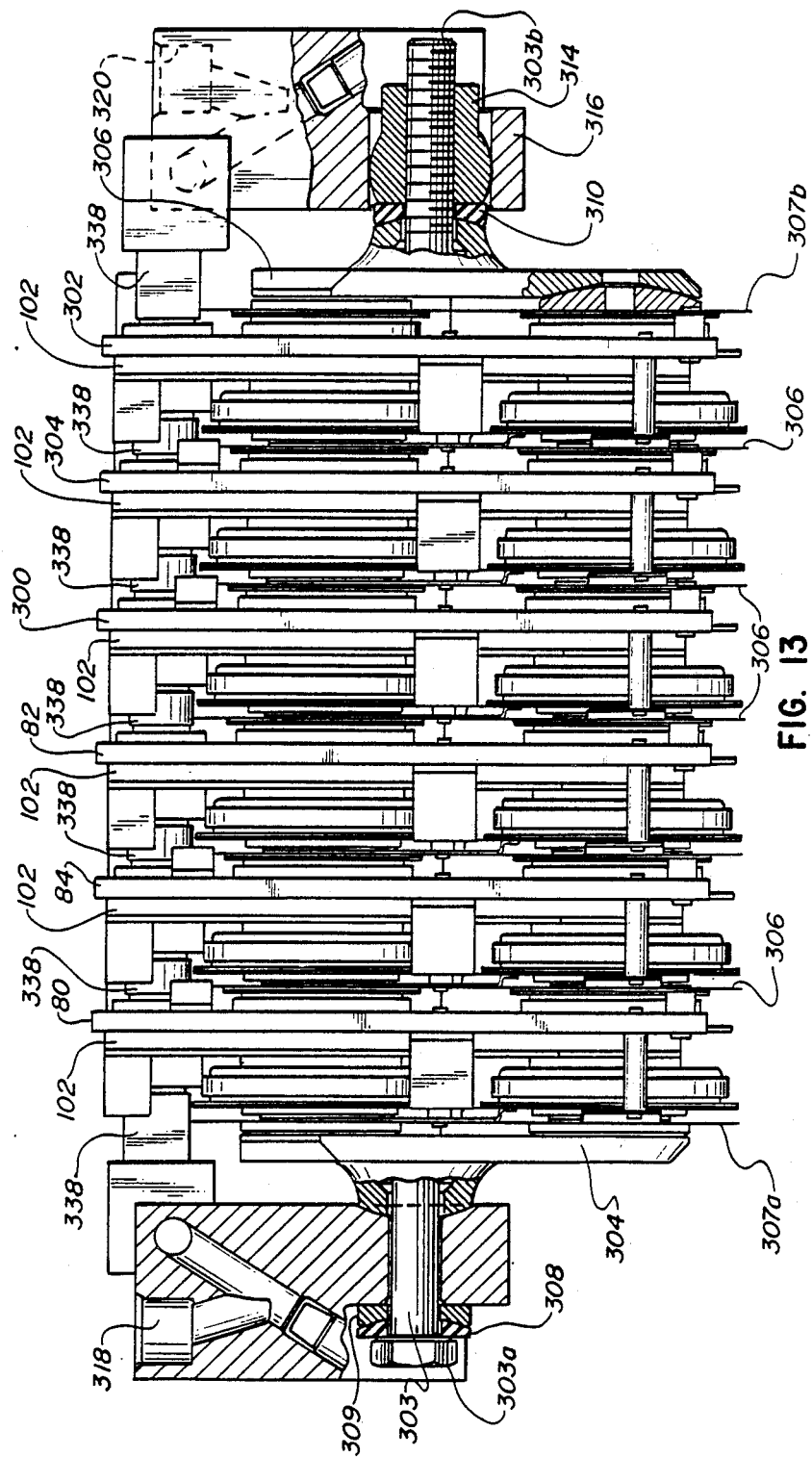
FIG. 13 comprises an elevational view of circuit boards assembled in a first stack and forming two legs of the three inverter legs of FIG. 2.
Figure 14:
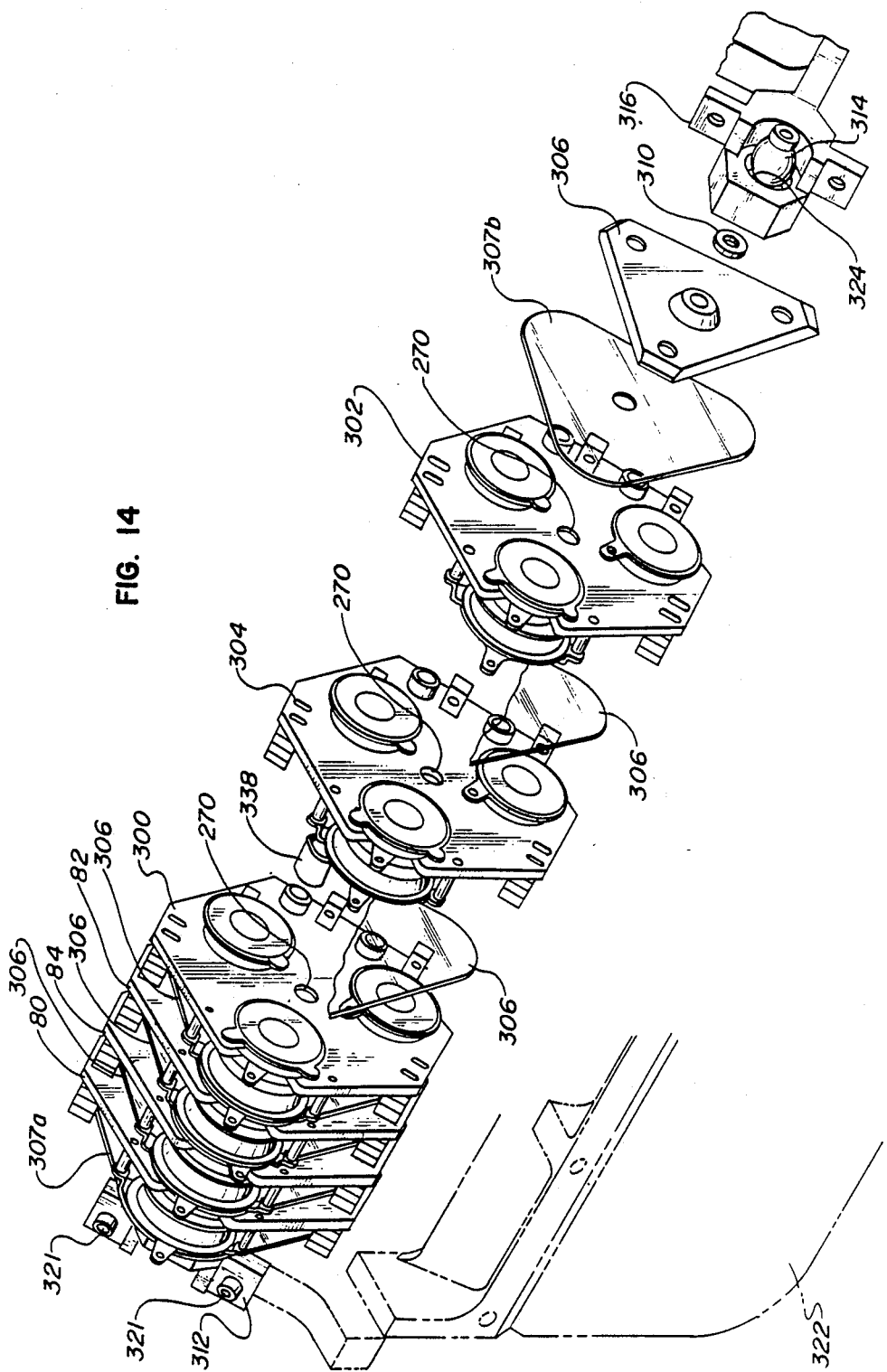
FIG. 14 comprises a partial fragmentary exploded perspective view of the stack of FIG. 13.
Figure 15:
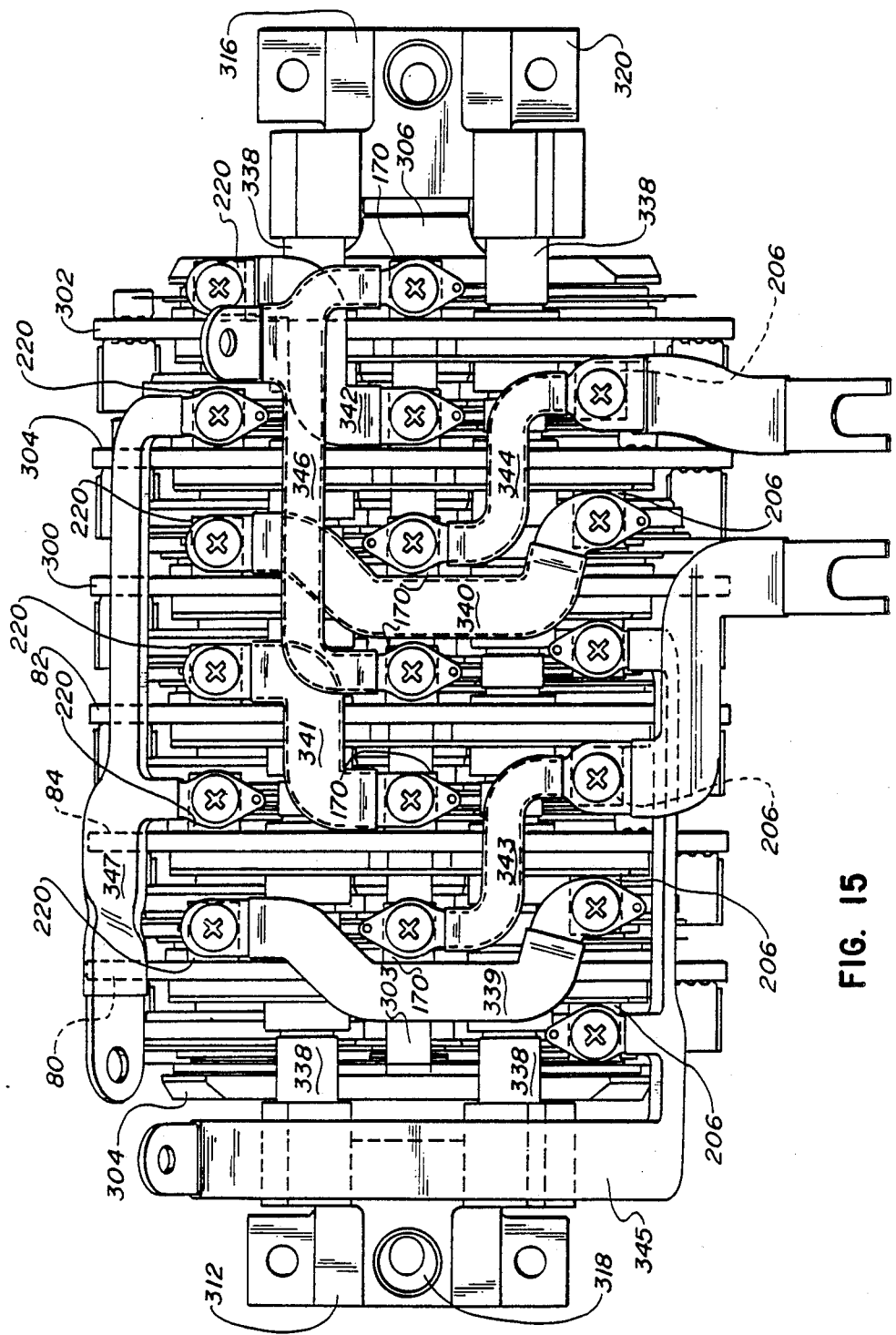
FIG. 15 is a further elevational view of the stack of FIG. 13 taken from a different angle illustrating the electrical connections between the switch assemblies.

As noted above, the circuit boards 80, 82 and 84 are electrically interconnected to form one of the inverter legs, for example the inverter leg 30a. Three additional circuit boards 300, 302 and 304 identical to the boards 80, 82 and 84, respectively, are interconnected to form the second inverter leg 30b. As seen in FIGS. 13-15, the circuit boards 80, 82, 84, 300, 302, 304 are arranged in side-by-side relationship with electrically insulating, thermally conductive sheets of Kapton 306, or another like material, therebetween to form a stack. Further Kapton sheets 307a, 307b are disposed next to the other surfaces of the stack adjacent the boards 80 and 302. The stacked switch assemblies are held together by a threaded bolt 303 (not shown in FIG. 14) which extends through aligned holes 270 in the boards 80, 82, 84, 300, 302, 304 and through aligned holes in end caps 304 and 306 and mounting brackets 312 and 316 which are disposed adjacent to the Kapton sheets 307a, 307b and the outer faces of the boards 80, 302, respectively. A head 303a of the bolt 303 and a pair of centering washers 308, 309 bear against the mounting bracket 312 and a bushing 314 threaded on an end 303b of the bolt 303 and a centering washer 310 bear against the end cap 306. The mounting bracket 312 in turn bears against the end cap 304. When the bushing 314 is tightened, the end caps 304 and 306 apply compressive force to the heat exchangers and the high power devices comprising the transistors and the diodes through the apertures 103 in the boards so that these components are forced into intimate physical contact to thereby establish low resistance electrical paths therebetween.

Preferably, the end caps 304, 306 are fabricated of titanium and are designed to enable a determination of the compressive force exerted against the high power devices and the heat exchangers 102 from the measured deformation of the end caps 304, 306 by the bushing 314.

The mounting brackets 312 and 316 include inlet and outlet ports 318 and 320, respectively, and are secured by bolts 321 (some of which are shown in FIG. 14) to a housing 322 of the generator 16 (shown in phantom in FIG. 14). The bushing 314 is free to move within a bore 324 in the mounting bracket 316 so that the stack may expand when subjected to heat. As illustrated in FIG. 7, each heat exchanger 102 also includes first and second ports 330, 332 which provide admittance to an internal passage 334 having a plurality of cooling fins 336 disposed therein. The ports 318 and 320 are interconnected by electrically non-conductive conduits 338, FIGS. 13-15, with the ports 330 and 332 of the heat exchangers 102 so that the heat exchangers are effectively coupled in parallel to allow for flow of cooling medium through the boards 80-84 and 300-304 (Only one of the conduits 338 is shown in FIG. 14).

As illustrated in FIG. 15, the electrical connections between the connectors 170, 206 and 220 of the boards are preferably made with flat copper bus bars. The connectors 220 of the boards 80 and 300 are connected to the connectors 206 of the boards 84 and 304 by bus bars 339 and 340, respectively. The connectors 220 of the boards 82 and 302 are connected to the connectors 170 of the boards 84 and 304 by bus bars 341 and 342, respectively. A bus bar 343 connects one phase output terminal 38 to the connector 170 of the board 80 and to the connector 206 of the board 82. A bus bar 344 connects a second phase terminal 38 to the connector 170 of the board 300 and to the connector 206 of the board 302. The DC link conductor 20a is coupled to the connectors 206 of the boards 80 and 300 by a bus bar 345. The DC link conductor 20b is connected to the connectors 170 of the boards 82, 302 by a bus bar 346. The neutral terminal 32 is coupled to the connectors 220 of the boards 84, 304 by a bus bar 347. The lines 64, 66, 68, 70, 72, 74, 77 and 79, FIG. 4, are coupled to respective boards 80, 82, 84, 300, 302, 304 using wires or other conductors which are soldered or otherwise electrically connected to the respective connection points thereof.

Referring now to FIG. 16, three additional circuit boards 350, 352 and 354 which are identical to the circuit boards 80, 82 and 84, respectively, are assembled in stacked relation with electrical components, indicated generally at 356, which together comprise the AC/DC converter and transient suppressor 18 to form a second stack 358. As noted with respect to the first stack, insulating Kapton sheets 360 electrically isolate the boards 350, 352 and 354. The heat exchangers 102 of the boards 350, 352 and 354 are interconnected by electrically non-conductive conduits 361 with cooling assemblies 362, 364 and 366 and with inlet and outlet ports 368 and 370 that are in turn disposed within mounting brackets 378 and 379, respectively. Similar to the stack illustrated in FIGS. 13-15, the stack 358 is maintained in assembled relationship by a bolt 373, end caps 374, 376, mounting brackets 378, 379, a bushing and washers which bear directly or indirectly against the end caps 374, 376. (The bushing and washers are not visible in FIG. 16). Again, compressive force is exerted by the end caps 374, 376 through the apertures 103 in the boards 350, 352 and 354 so that the high power devices comprising the diodes and transistors are forced in intimate physical contact with the heat exchangers 102 to provide a low resistance path therebetween.

Bus bars 380, 382, 384, 386, 388 and 390 interconnect the boards 350, 352 and 354 and the components 356 of the AC/DC converter and transient suppressor 18. The boards 350, 352 and 354 comprise the remaining inverter leg, for example the inverter leg 30c.

The arrangement of the components of each circuit board permits the boards to be stacked next to one another so that the size of the resulting inverter is minimized. Cooling fluid is provided to the heat exchangers so that heat is effectively removed even from the components located in the middle of the stack. Thus, a large number of heat-producing components can be assembled within a small space without damage due to heat build-up. In addition, compressive force as required is applied only to those components which require same for proper electrical connection, i.e. the high power devices and the heat exchanger.

We claim:

1. A power converter assembly having an input and an output, comprising:
   first and second circuit boards each of which includes an aperture therethrough;
   first and second heat exchangers secured to the first and second circuit boards, respectively;
   first and second high power devices disposed adjacent the first and second heat exchangers, respectively;
   means for applying compressive force through the board apertures against the high power devices and the heat exchangers to cause the first and second high power devices to be in intimate physical contact with the first and second heat exchangers, respectively, so that low resistance electrical paths are established between the high power devices and the heat exchangers; and
   means disposed on the boards for connecting the power devices between the input and the output.

2. The power converter of claim 1, further including electrical components mounted on each board and means for connecting the high power devices to the electrical components.

3. The power converter of claim 1, further including a sheet of electrically-insulative, thermally-conductive material disposed between the first and second circuit boards.

4. The power converter of claim 1, wherein the applying means comprises a pair of spaced, end caps wherein the circuit boards, heat exchangers and power devices are disposed between the end caps and means for forcing the end caps toward one another.

5. The power converter of claim 4, wherein the forcing means includes a bolt extending between the end caps having a head and a threaded end and a bushing disposed on the threaded end wherein the head and bushing apply force against the first and second end caps, respectively.

6. The power converter of claim 5, wherein the circuit boards and end caps include aligned holes and wherein the bolt extends through the aligned holes.

7. The power converter of claim 1, wherein the high power devices comprise power transistors and power diodes.

8. The power converter of claim 1, further including electrically non-conductive conduits interconnecting the heat exchangers wherein coolant is supplied to the interconnected heat exchangers.

9. An inverter, comprising:
   positive and negative switch assemblies mounted on circuit boards and heat exchangers disposed in stacked relationship with respect to each other wherein each switch assembly includes power diodes and power transistors adjacent an associated heat exchanger;
   means for clamping the power diodes and power transistors of each switch assembly against the heat exchanger associated therewith stacked circuit to provide physical contact with the adjacent switch assemblies, and
   means for electrically connecting the switch assemblies to provide constant-frequency alternating current.

10. The inverter stack of claim 9, wherein said switch assemblies are stacked with an electrically insulating spacer between adjacent switches and wherein said switch assemblies are held in physical contact with a threaded bar or rod which extends through aligned holes in said substrates in end caps wherein the threaded bar of rod is fitted with nuts to force the end caps together.

* * * * *